United States Patent [19]

Palanisamy

[11] Patent Number: 4,968,942
[45] Date of Patent: * Nov. 6, 1990

[54] METHOD FOR MONITORING AIRCRAFT BATTERY STATUS

[75] Inventor: Thirumalai G. Palanisamy, Morristown, N.J.

[73] Assignee: Allied-Signal Inc., Morris Township, Morris County, N.J.

[*] Notice: The portion of the term of this patent subsequent to Jun. 26, 2007 has been disclaimed.

[21] Appl. No.: 313,121

[22] Filed: Feb. 21, 1989

Related U.S. Application Data

[63] Continuation-in-part of Ser. No. 257,913, Oct. 14, 1988.

[51] Int. Cl.$^5$ .............................. G01N 27/46
[52] U.S. Cl. .................... 324/430; 324/427; 324/433
[58] Field of Search ............... 324/503, 426, 427, 430, 324/431, 433; 320/48; 340/636

[56] References Cited

U.S. PATENT DOCUMENTS

| | | | |
|---|---|---|---|
| 3,971,980 | 7/1976 | Jungfer et al. | 324/427 |
| 4,433,294 | 2/1984 | Windebank | 324/426 |
| 4,665,370 | 5/1987 | Holland . | |
| 4,678,998 | 7/1987 | Muramatsu . | |
| 4,678,999 | 7/1987 | Schneider . | |
| 4,719,427 | 1/1988 | Morishita et al. | 324/427 |
| 4,745,349 | 5/1988 | Palanisamy et al. | 320/48 |

FOREIGN PATENT DOCUMENTS

| | | | |
|---|---|---|---|
| 0273577 | 7/1988 | European Pat. Off. | 324/427 |
| 3321814 | 1/1985 | Fed. Rep. of Germany | 324/427 |
| 0240876 | 10/1987 | Japan | 324/427 |
| 1454358 | 11/1976 | United Kingdom | 324/427 |
| 8302005 | 6/1983 | World Int. Prop. O. | 324/427 |

*Primary Examiner*—Reinhard J. Eisenzopf
*Assistant Examiner*—Robert W. Mueller
*Attorney, Agent, or Firm*—Ernest D. Buff; Gerhard H. Fuchs; Richard C. Stewart

[57] ABSTRACT

An aircraft storage battery is monitored to determine battery capacity, state of charge and certain fault conditions. The ambient temperature, battery voltage on-board charger output voltage and current to and from the battery are continuously measured. Current voltage (I-V) data is analyzed to determine the internal resistance and polarization of the battery. A determination is made regarding state of charge and fault conditions produced by corroded terminals and low electrolyte level. The low temperature starting limit is determined by comparing the battery's power output capability with starting power requirements of the aircraft. Data produced by the comparison are indicated on the dashboard of the vehicle.

20 Claims, 8 Drawing Sheets

1. SLI BATTERY
2. STARTER MOTOR LOAD
3. ACCESSORY LOAD
4. POWER SOURCE (ALTERNATOR/REGULATOR)
5. DIODE
6,7 SHUNTS
8-11 ACTUATORS

V - RESPONSE VOLTAGE
I - APPLIED CURRENT
d - SLOPE (dV/dt) OF V
BATTERY DETAILS:
 20 Ah CAPACITY
 6 CELLS (FLOODED)
RAMPING DETAILS:
 RAMP UP - 60 SEC
 HOLD - 5 SEC
 RAMP DOWN - 60 SEC

METHOD FOR MONITORING AIRCRAFT BATTERY STATUS CROSS-REFERENCE TO RELATED APPLICATIONS

This is a continuation-in-part of copending application Ser. No. 257,913 filed Oct. 14, 1988, entitled Automotive Battery Status Monitor.

BACKGROUND OF THE INVENTION

1. Field of the Invention

This invention relates to a method and apparatus for automatically testing, monitoring and maintaining an aircraft battery system and more particularly to a system by which the condition of the aircraft storage battery, as well as the low temperature starting limit, maintenance requirements and service life thereof can be monitored.

2. Description of the Prior Art

Systems for determining one or two of such battery conditions as battery capacity, state of charge, defects in the battery and the charging system, maintenance requirements and timely indication of the need to replace the battery or the on board charger, have been developed to facilitate maintenance of a reliable and safe aircraft battery system. Manual determination of these parameters is expensive, and time consuming. With the introduction of microprocessors, the battery characteristics, engine starting requirements and operational characteristics can be determined automatically, providing optimum life and safety and reliability.

Aircraft batteries provide power for starting, prestart check-ups, communications with control tower and canopy operation. Of these, the starting function is the first one affected by a weakened battery because the starter needs more power than other components. Since the above functions are vital for the reliable and safe operation of the aircrafts, it is useful to know when the battery is on the verge of losing its useful life.

Aircrafts have been using nickel cadmium batteries because of their light weight. However, the maintainance of these batteries has been a primary concern. Therefore, recently sealed lead acid batteries are being introduced for aircraft application. Any device that advises the user about the maintainance requirements, state of charge, battery health, and the end of useful life of these aircraft lead acid batteries will be very useful.

Generally the nominal voltage of these batteries is 28 volts. The battery capacity can be from 7 Ah to several tens of amperehours. These batteries are very similar to the SLI batteries in their function. The battery gives out large current pulse to start the engine and almost immediately after starting an on-board charger recharges the battery. Some aircrafts are started by other means such as compressed air capsules.

Several conditions of component status can cause aircraft battery systems failure. These are: Low state of charge of the battery, loss of the battery capacity, corroded terminals, low level of the electrolyte defective charging system and defective starter motor. A battery status monitor should function to sort out there problems automatically. The monitor should diagnose a problem as it develops and warn the user in advance of imminent failure. However, battery monitors heretofore disclosed do not identify each of the aforementioned problems; most of them attempt to determine only the state of charge of the battery.

Battery monitors originally comprised merely an ammeter and/or a voltmeter. They provided limited information of a type useful only to knowledgeable users. To have the battery tested, the battery was disconnected from the electrical system by a skilled mechanic and discharged through a known load. Alternatively, monitoring instruments were employed to derive the battery status parameters using an a.c. signal without discharging the battery through a load. Such monitoring instruments require that the battery be disconnected from the electrical circuitry of the user system. Even then they provide information about the state of charge solely.

Conventionally, the state of charge of the battery has been determined by measuring specific gravity of the electrolyte. This method is predicated on the fact that the specific gravity of the sulfuric acid electrolyte decreases when the battery is discharged and increases when the battery is charged. Normally, the specific gravity of the battery electrolyte ranges from about 1.28-1.30 when the battery is fully charged. Such a method is laborious and cannot predict loss of battery capacity in advance. Furthermore, such problems as corroded terminals are not detected by this method.

An alternative method for determining the state of battery charge involves the continuous counting of charge into and out of the battery. This method is subject to accumulation of error due to the current consumed by gassing in the battery and changes in battery capacity arising from corrosion of the electrode plates and shedding of active material. A device of this type using a current to frequency converter, is described in U.S. Pat. No. 4,678,999 to J. F. Schneider.

A battery's maximum power output is determined by its voltage and internal impedance. Generally the internal impedance of the battery increases with the life of the battery and with a decrease in its state of charge. In U.S. Pat. No. 4,678,998 to Muramatsu, there is described a device based on this principle. According to Muramatsu, the relationship between battery impedance, remaining capacity and remaining service life is predetermined at different frequencies and stored in memory. To determine the battery condition, a computer evaluates the internal impedance at a few frequencies and looks up to the stored table of predetermined values to obtain the remaining service life of the battery. Such a device is subject to the drawback that each battery or battery group has to be subjected to tests before installation to generate the table of predetermined values.

U.S. Pat. No. 4,665,370 to Holland describes a battery monitor wherein a cranking motor furnishes the load for the battery and an electronic apparatus automatically measures the condition of the battery each time the engine is started. The battery monitor compares the unloaded battery voltage with the voltage under load and indicates that the battery is bad if the voltage differential exceeds a predetermined limit. One disadvantage of this device is the inability thereof to distinguish between a low state of battery charge, a fully charged battery having low capacity and additional faulty conditions of the battery such as corroded terminals or low electrolyte level.

SUMMARY OF THE INVENTION

The present invention provides a method and apparatus for monitoring an aircraft (starting) storage battery to determine certain conditions, including defects and characteristics, of the battery. Generally stated, the apparatus comprises a microprocessor means located on the aircraft for controlling the operations of the apparatus. A software means instructs the microprocessor means to control the sequence of the operations. Memory means are connected to the microprocessor means for storing the software instructions and predetermined relationships between the internal resistance of said battery, the tolerable limit of the internal resistance and the ambient temperature of the battery.

A digital to analog converter means is connected to the microprocessor means for converting digital signals from the microprocessor means to analog signals. The digital to analog converter means has connected thereto a direct current power generator means for producing electric power at voltage and current required by the microprocessor means. A current sensor means, connected to a terminal of the battery measures the current passing into and out of the battery. The ambient temperature of the battery is measured by a temperature sensor means, located in close proximity thereto. A voltmeter means measures the voltages of the battery, current sensor, temperature sensor and direct current power generator means. Connected to the voltmeter is an analog to digital converter means for converting the analog signals from the voltage measurements to digital signals appointed for transfer to the microprocessor. A second software means analyzes the current, voltages, temperature and determines the internal resistance and polarization of the battery, defects in said battery and low temperature starting limit to establish the battery maintenance and replacement requirements. The apparatus has an actuator means for controlling the electrical circuits connecting the sensors, the direct current power generating means and the battery. A display means, controlled by the microprocessor, indicates said battery status and advice.

In addition, the invention provides a method for monitoring an aircraft storage battery, which comprises the steps of:

(a) measuring continuously the ambient temperature, the battery voltage, the on-board charger output voltage, and the current to and from the battery;

(b) analyzing the current-voltage (I-V) data to determine the internal resistance and polarization of the battery;

(c) determining the state of charge, the fault conditions produced by corroded terminals, and low electrolyte level;

(d) determining the low temperature starting limit by comparing the battery's power output capability with starting power requirements of said aircraft starting system; and (e) indicating data produced by such comparison.

An alternative method, provided by the invention, involves determining the battery capacity by measuring the charge input to the battery and the corresponding increase in the battery voltage.

Yet another method provided by this invention for monitoring the condition of and providing status and advice concerning the aircraft storage battery comprises the steps of:

(a) subjecting the battery to a special test cycle wherein a predetermined profile of current or voltage is imposed onto the battery by the charging system and the battery response voltage or current is measured;

(b) evaluating the data in the forms, dV/dI versus I, or dI/dV versus V;

(c) determining the battery characteristics, including the capacity, and the voltage;

(d) determining the battery defects, including mismatched cell, soft-shorted cell, and loss of capacity; and (e) indicating the data and advice.

A battery status monitor made using the method and apparatus of this invention can determine the present battery capacity, state of charge and fault conditions. When the battery is in a predetermined range of its state of charge near its fully charged status, the monitor can cut out the charger through a clutch, thereby eliminating over charge. When the state of charge is below a set limit, or the accessory current drain is above a preset limit, or the ambient temperature is below a preset limit, the power source is kept operational.

An important feature of this invention is its capability to indicate the low temperature starting limit of the aircraft together with the battery's present conditions. The monitor arrives at a number for the low temperature limit by taking into account both the engine starter motor requirements and the battery's ability to meet them.

An important advantage of this invention is that the monitor can offer unbiased advice to the user concerning the decision whether to maintain or to replace the battery. This monitor, by evaluating the values of the internal resistance and the polarization, is capable of indicating whether the terminals need cleaning or the battery needs water. Upon detecting conditions such as the presence of (i) one or more bad cells (low capacity mismatched cells or soft-shorted cells), or (ii) high internal resistance in the absence of any other defects, the monitor indicates the need to change the battery.

BRIEF DESCRIPTION OF THE DRAWINGS

The invention will be more fully understood and further advantages will become apparent when reference is made to the following detailed description of the preferred embodiments of the invention and the accompanying drawings, in which.

DESCRIPTION OF THE PREFERRED EMBODIMENT

Since aircraft starting and automotive starting conditions and the battery conditions are very similar, all our tests were made with automovtive batteries and automotive engine conditions. The only difference is in voltage of the batteries.

Figure 1:
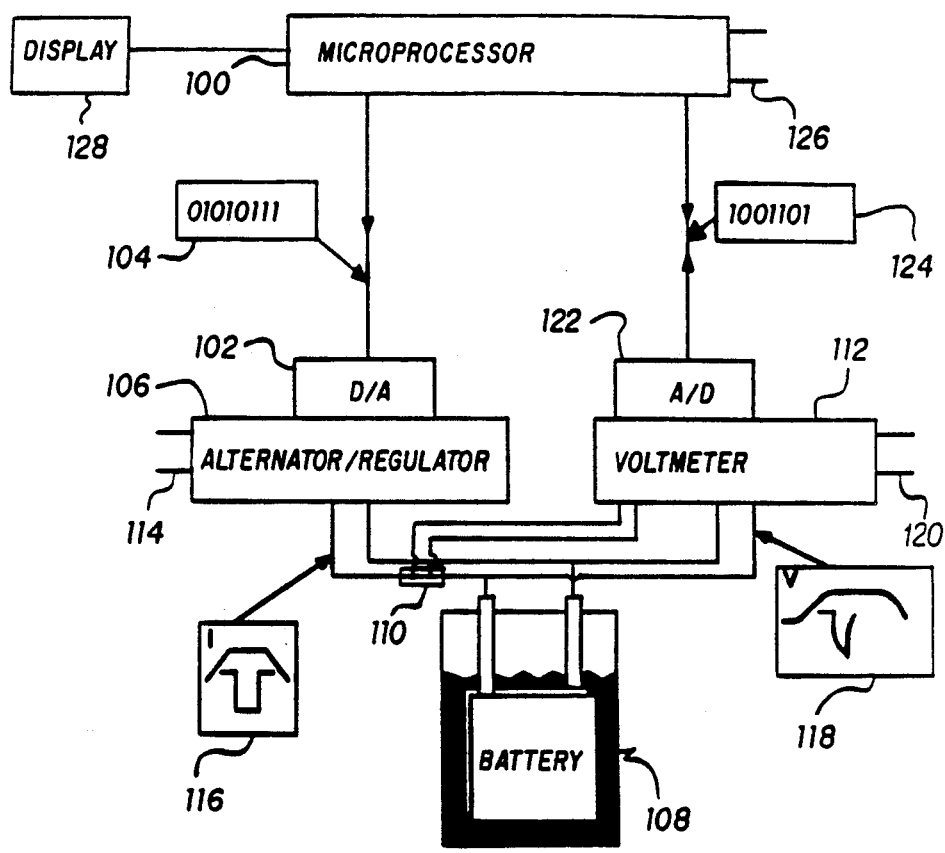
FIG. 1 is a block diagram showing the battery status monitoring apparatus of the invention in conjunction with other components of an aircraft starting system.
Figure 3:
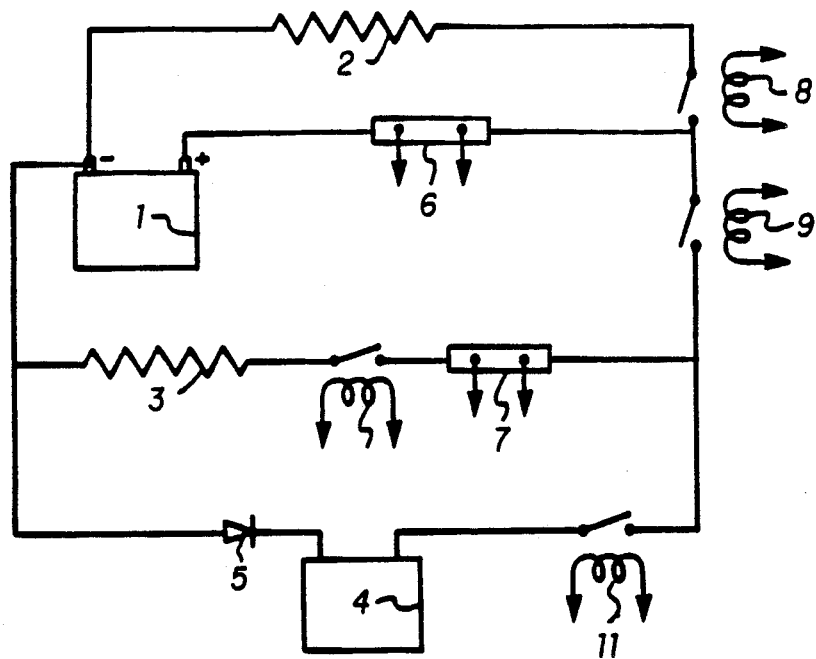
FIG. 3 is a schematic circuit diagram for testing the battery status monitor.

Referring to the drawings, there is illustrated in FIG. 1 a block diagram of the battery status monitor of this invention in conjunction with some of the other components of the vehicle starting system. A microprocessor 100, located on the vehicle for controlling the operations of the apparatus, has ROM and RAM memory for storing software, which instructs the microprocessor on the sequence of operations. The memory also stores the predetermined relationships and data concerning the battery and the vehicle's starting system. The microprocessor is also connected to a digital to analog converter 102, which converts the digital signals 104 to analog signal and transmits the analog signal to the onboard charging system 106. The charging system which is substantially an alternator/regulator in automobile is connected to the battery 108 through a current sensing shunt 110 and to a voltmeter 112. The charging system is also connected to other components of the vehicle through the leads 114. A programmed current 116 or voltage is provided to the battery by the charging system. The battery's response voltage 118 or current is measured by the voltmeter which is also connected to other components of the vehicle, including the temperature sensor, through the leads 120. An analog to digital converter 122 attached to the voltmeter converts the analog measurements to digital signal 124 and transmits the digital signal 124 to the microprocessor which is also connected to other components of the vehicle through the leads 126. The accessories and the starter motor, connected in parallel with the battery and the charger, are shown in FIG. 3.

Figure 2:
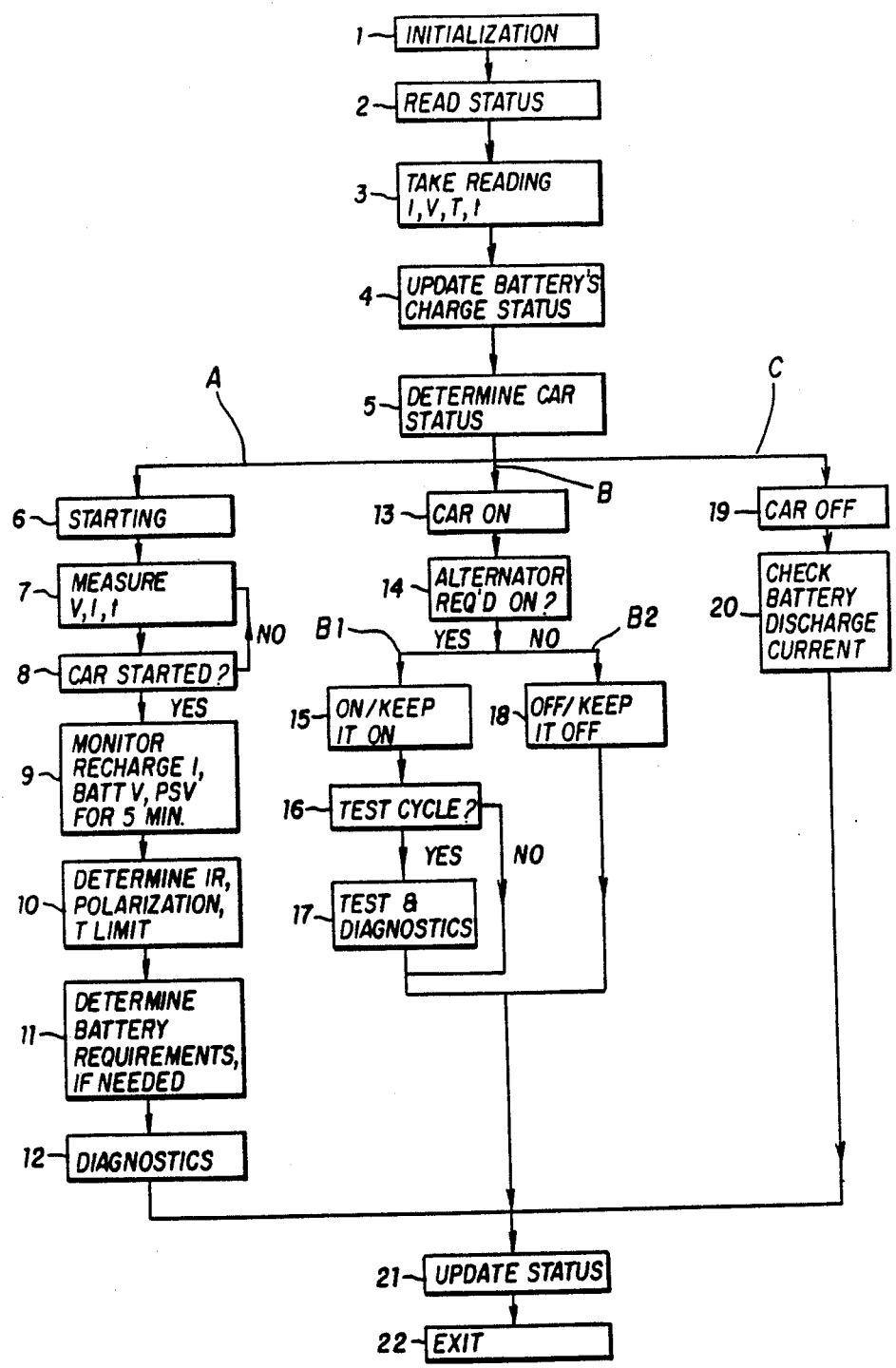
FIG. 2 is a flow diagram of a preferred embodiment of this invention.

The flow diagram illustrated in FIG. 2 shows the sequential operations of the battery status monitor. As illustrated, the flow diagram applies to the test apparatus and the test circuit, of FIG. 3, and is controlled by a multiuser microcomputer. For the commercial device to be installed in the aircrafts, steps 2, 21 and 22 may be eliminated without affecting the operations of the battery monitor; the microprocess or will execute step 3 instead of step 21, thus forming a continuous loop for the sequence of operations.

In step 1, all the variables are initialized. This step is executed only one time, when the device is installed in the aircraft. The monitor then reads the values of all variables typically representing the required/operational characteristics of the aircraft battery system and the battery in step 2; this step is equivalent to step 21. It will be understood by those practicing the art that step 2 is not necessary in the commercial device since it will have a dedicated microprocessor with a continuous loop for the sequence of operations. In step 3, monitor measures the ambient temperature (T), battery voltage (V), the power source voltage ($V_s$), current (I) using the shunt or other current sensing device, and real time (t). The power source in the test circuit, illustrated in FIG. 3, is a power supply with voltage and current ratings equal to the output voltage and current of an automotive alternator/regulator. Hereafter, the combination of alternator, rectifier, voltage and current controllers will be referred to as the power source.

In step 4, the battery's state of charge is updated using a combination of the charge integration technique and the open circuit voltage (OCV). The first method based on OCV to determine state of charge (SOC) makes use of the fact that the open circuit voltage of a fully charged lead acid cell exhibits 0.2 V higher than the OCV of a completely discharged cell. The cell voltage varies linearly in between these extremes. The voltage of a battery when no current is flowing into or out of the battery is normally referred to as the open circuit voltage. The state of charge can be calculated from the typical open circuit voltage at fully charged status ($OCV_{FC}$), the number of cells (NOC) in the battery and the present open circuit voltage (OCV) as follows:

$$SOC = 100 - (((OCV_{FC} - OCV)/0.2*NOC)*100)\% \qquad (1)$$

The open circuit voltage used in this calculation should be free from polarization. The polarization normally arises from nonuniformity of the electrolyte concentration at or near the electrodes compared with the electrolyte concentration in the bulk. The voltage measured until several minutes after a charge or discharge invariably includes a significant polarization voltage, even though there is no substantial current flowing from or to the battery.

The second method involves integration of the current that goes into and out of the battery at all times. The monitor starts counting the charge from a predetermined charged state of the battery. The total charge put into the battery from the power source is added to the stored charge of the battery. Similarly the charge taken out of the battery during starting and by the accessories is subtracted from the stored charge. This net charge divided by the battery capacity gives the state of charge of the battery. Any time the monitor detects that the battery is fully charged, it resets the state of charge to 100%. The fully charged state of the battery is recognized when the open circuit voltage of the battery is above a predetermined value. The fully charged status of the battery is aldo recognized through the test cycle of the battery. The state of charge determined only by the charge integration method will have error due to gassing in the battery and change in battery capacity arising from corrosion of the electrode plates and shedding of active material. Therefore, the monitor uses this charge integration method from the instant of the starting of the car until a preset limit of time, preferably two hours, elapses from the time and engine is switched off. As the skilled practioner in the art will appreciate, the combination of the two methods described above offers accurate value of the state of charge of the automotive battery.

In step 5, the status of the starting system or other user system is determined. If the system is in the starting process, the monitor follows the path beginning with step 6 in branch A. Otherwise, branch B beginning with step 13 is followed when the on-board charger is working and route C with step 19 is followed when the system is off.

In route A. the monitor measures the parameters V, I and t repeatedly in steps 7 and 8 until the aircraft engine has started or the user has stopped the starting process. The monitor can recognize the status of the starting process from the sign and value of the current I. Practitioners of the art recognize that the starting process can be identified in several other ways as for example from the starting switch. If the engine has started, the monitor continues at step 9; otherwise control is transferred to step 3 again. In step 9, the monitor measures the recharge current, battery voltage and the power source voltage for a predetermined period of time, preferably 5-10 minutes. If the system is switched off in the meantime, the monitor will go to step 3. In step 10, using the measurements during the starting process, the monitor determines the internal resistance (IR) and polarization ($P_R$).

Figure 4:
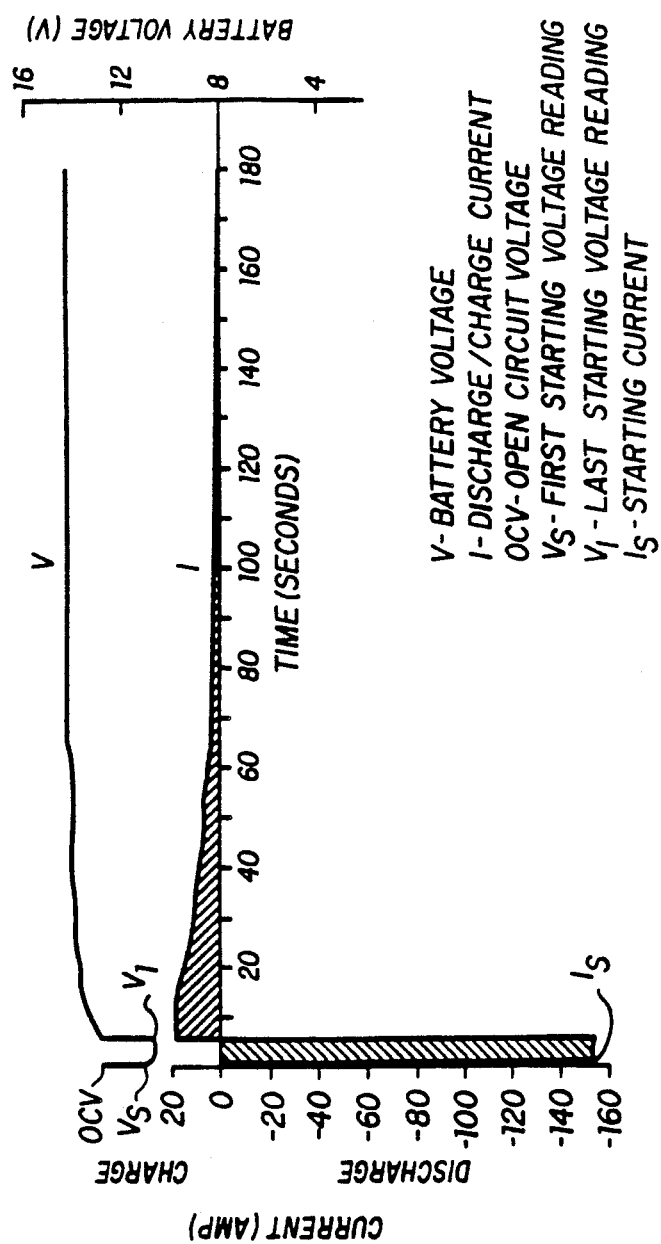
FIG. 4 is a graph depicting current voltage characteristics of an automotive battery during a sudden discharge and immediate recharge similar to starting of an aircraft.

In accordance with this invention, the internal resistance of an aircraft battery can be determined from the instantaneous change in voltage at the beginning and at the end of a current input to or output from the battery. The skilled practitioner in the art will appreciate that there are numerous ways of achieving this, for example, using any of the accessories for a discharge pulse current or the power source of the aircraft for a charge pulse current. According to the preferred embodiment of this invention, the internal resistance of the aircraft battery is determined from its open circuit voltage (OCV), the first measured voltage ($V_s$) and the initial current ($I_s$) that flows from the battery to the starter load during the starting process as illustrated in FIG. 4, and according to the equation 2:

$$IR = (OCV - V_s)/I_s \qquad (2)$$

The maximum instantaneous power the aircraft battery can output is inversely related to its internal resistance. Thus according to this invention, the battery's power output capability is determined from the internal resistance.

The battery polarization resistance ($P_R$) arises from nonuniformity in electrolyte concentration in the electrode to the bulk of the electrolyte between the plates. It is determined from the above parameters, $V_s$ and $I_s$ and the battery voltage after a predetermined time interval or the last voltage reading ($V_l$) during the starting process according to the equation:

$$P_R = (V_s - V_l)/I_s \qquad (3)$$

It is appreciated that the internal resistance and polarization can be determined as frequently as desired making use of the starting or switching off of the car engine or switching on or off of any accessory in the aircraft.

Figure 5:
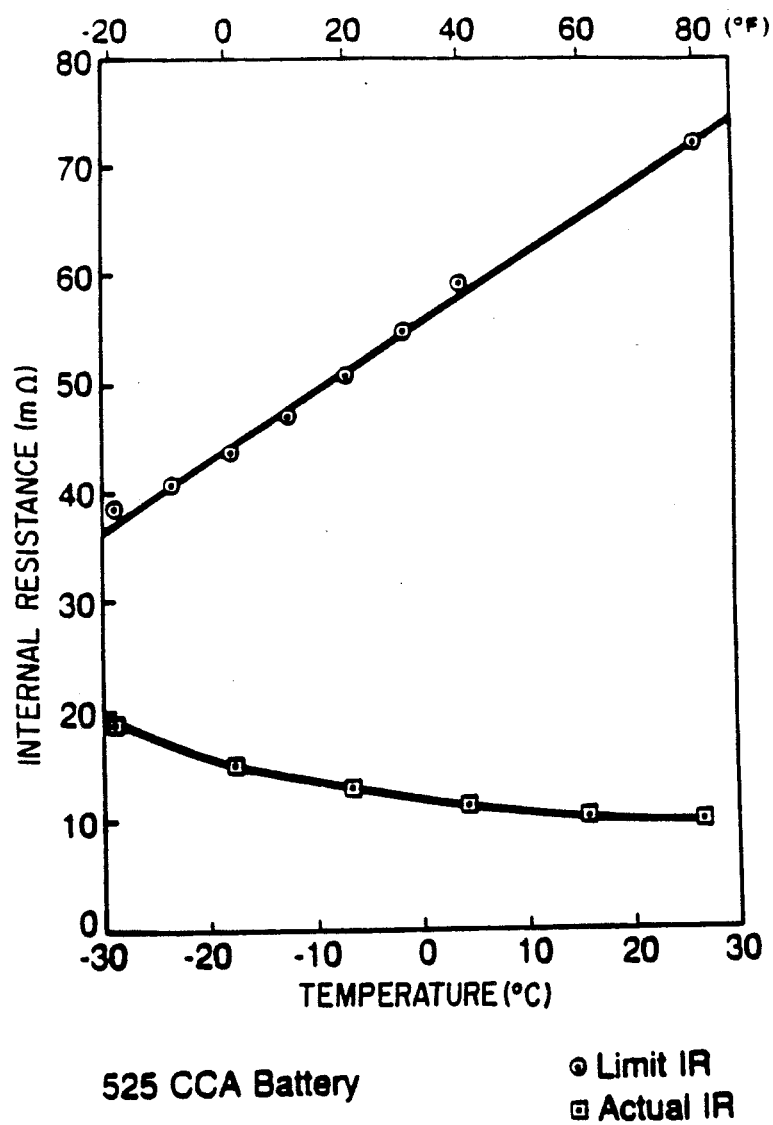
FIG. 5 is a graph depicting the battery internal resistance and the maximum allowable limit of internal resistance as a function of temperature for a 525 CCA battery.

One of the important aspects of the preferred embodiment of this invention is its ability to predict the low temperature limit up to which the battery would be able to start the car. The temperature dependence of the starting power requirements of an automobile, which is very similar to an aircraft starting system and the temperature dependence of the power output capability of the recommended size battery are illustrated in FIG. 5 in terms of the battery's internal resistance (IR). The IR is inversely proportional to the battery's maximum output power. It is clear from FIG. 5 that the battery can easily meet the required starting power at high temperature region of the normal usage temperature range. As the ambient temperature decreases, as for example in winter season, the battery's output power decreases and the aircraft starter's required starting power increases. According to this invention, the aircraft cannot be started below the temperature where these two curves cross.

In accordance with the findings of this invention, the dependence of power requirements of various aircraft starting systems the corresponding recommended battery's power output may be generalized. As for example, such generalized data for automobiles are described as in the curves illustrated in FIG. 6. At temperatures around −30° C., the power output capability of the battery is only half of that at 27° C., whereas the power required to start the system at this low temperature is two times the power required at 27° C.

Figure 6:
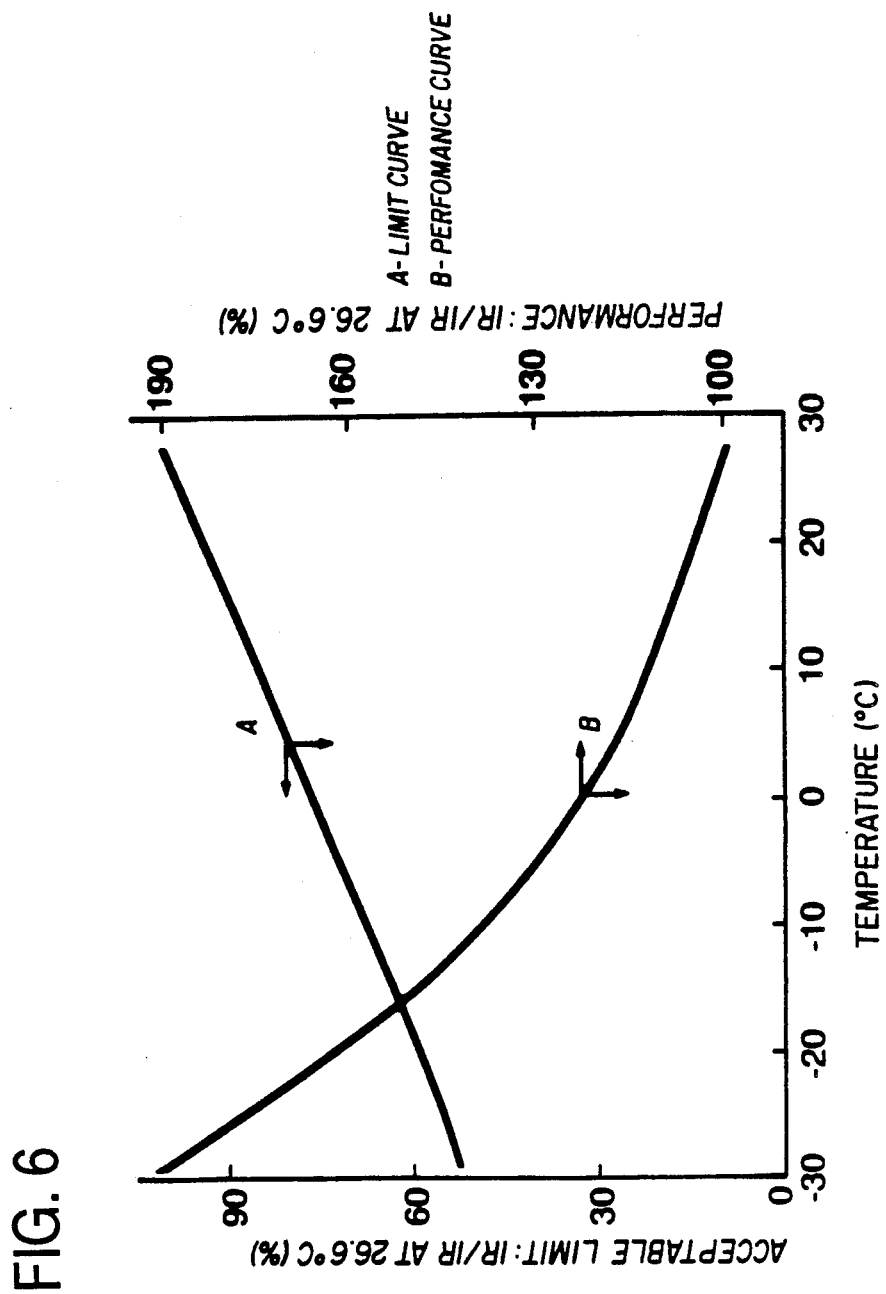
FIG. 6 is a graph showing the temperature dependence of battery requirements and battery performance relative to their respective values at room temperature (26.6° C.)
Figure 7A:
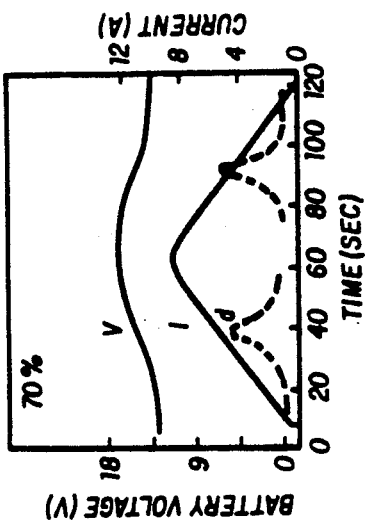
FIG. 7 is a block diagram showing the method for detection of gas point by current ramping technique.
Figure 7B:
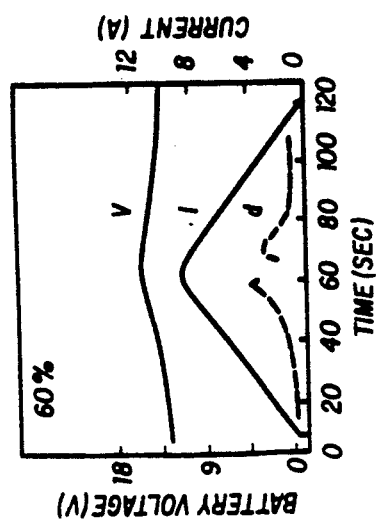
Figure 7C:
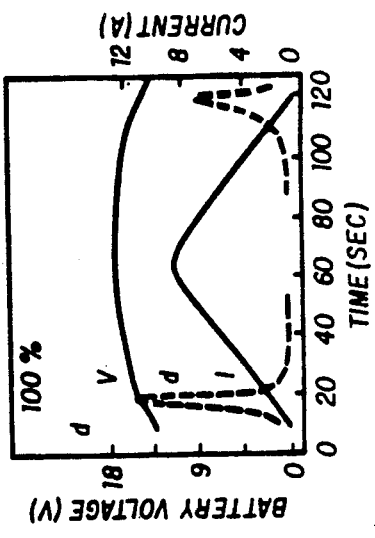
Figure 7D:
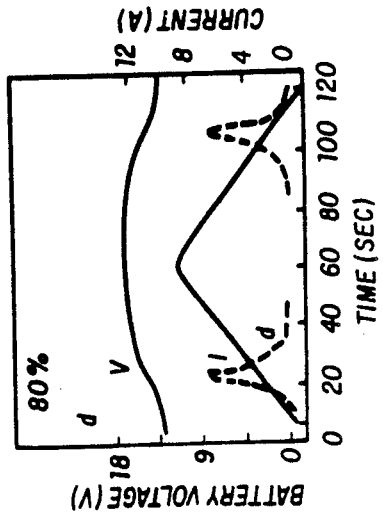

Next in step 10, the monitor then calculates the internal resistance of the battery at other temperatures using the IR determined in step 10, the temperature measured in step 3 and the relationship in curve B of FIG. 6. Similarly, the acceptable limits of IR at various temperatures are calculated using the data in curve A of FIG. 6, if the acceptable IR limit is known at any one temperature. This acceptable IR limit is calculated from the power requirements of the starting motor load which, in turn depends on the size and model of the engine. These power data can be obtained from the manufacturer for one or more temperatures. Alternately, the monitor can determine these data in step 11 from its experience during the first week of its operation. For example, the monitor can measure the ambient temperature (step 3) and the current delivered by the battery during the starting process for the first few preset number of startings, and determine the acceptable IR limit in each case at a particular preset temperature, as for example 27° C., using the curve A in FIG. 6. The monitor then takes the average of these values as the engine starting requirement at that preset temperature. Using these two sets of data in relative terms, e.g., in percentage, curves A and B, illustrated in FIG. 6, the monitor calculates the absolute data such as in FIG. 5. The monitor then determines the temperature at which the two curves in FIG. 5 cross. This represents the temperature at which the battery's power output capability matches the power requirements of the starting motor.

All batteries can be rated in what is known as Cold Cranking Amperes (CCA) in the trade. In accordance with this invention, the battery's room temperature acceptable internal resistance limit (in milliohms), e.g., 27° C., multiplied by the rated CCA (in amperes) seems to be constant, around 37,800. This is true for all vehicles which use a 6 cell 12 volt lead acid battery system. Similarly, for aircraft application a different relationship can be determined. Therefore the limit IR is obtained as follows:

$$\text{limit } IR = (37,800/CCA) \qquad (4)$$

Practioners of the art appreciate that this constancy number would be different for different temperatures and any particular temperature can be used.

Next in step 12, various diagnostics are performed using the data collected during starting and recharging the battery right after starting. Those include maintenance requirements, as for example, cleaning terminals and adding water. A preferred version of the monitor recognizes maintenance needs as they arise and advises the driver accordingly. Soon after a battery, such as lead acid battery, is discharges or charged, the voltage measured across the battery terminals changes even though the battery is in open circuit, due to the nonuniformity of the electrolyte concentration in the pores of the electrodes and the bulk, normally known as concentration polarization. According to this invention, as the electrolyte level decreases, the polarization as defined in equation 3 increases. However, the polarization is also large when the state of charge is low though the electrolyte level is adequate. The monitor distinguishes between these two conditions by examining the state of charge determined earlier in step 4.

With the extensive use of maintenance free sealed batteries in aircrafts, cleaning corroded terminals may be the most common maintenance problem for the battery. As the battery terminals corrode with time, the resulting lead compounds (oxide and sulfate) on the terminals cause a substantial increase in resistance at the terminal to wire connection. The high resistance leads to a large voltage drop reducing the power available for the starter motor. This often results in inability to start the engine. The preferred version of this invention can detect this problem as it arises and warn the user in advance. The positive and negative battery voltage sensing wires are fused with the battery's positive and negative lead wires respectively near the end of the wires connecting to the battery terminals. Therefore, the internal resistance determined by the monitor includes all resistance from positive lead wire end to negative lead wire and including the contact resistance between the wires and the battery terminals. The battery internal resistance remains within a narrow range as long as the state of charge is above 70% and the battery has not lost capacity substantially. A preferred embodiment of this monitor advises the driver to clean the terminal when the determined internal resistance is larger than a predetermined value, as for example, more than twice the initial internal resistance of the battery at a preset temperature and the polarization is less than normal.

A primary objective of this invention is to advise the user of the necessity to change the battery before it becomes weakened to an extent that it cannot deliver the required power. All batteries, as for example the aircraft lead acid batteries, lose capacity with age due to shedding of the active material and, irreversible change and unrechargeability of part of the active material. This is reflected in its internal resistance which correspondingly increases with age. A preferred embodiment of this invention, when it identifies larger than a preset limit of internal resistance of the battery, lower than a preset percentage of original capacity and a state of charge higher than 80%, advises the user to change the battery. The monitor also advises to change the battery when it detects a soft shorted cell or mismatched capacity cell. The procedure how it detects these situations will become clear in later steps.

After step 12, the control is transferred sequentially to step 21 wherein all parameters and variable values are stored in memory, steps 22, 1, 2 and 3. In commercial device, the control will be transferred to step 3 from step 12 due to the continuous operational loop. After passing through steps 4 and 5, when the charging system is on and running, route B is followed.

Next in step 14, the monitor checks whether the on board charger is required to be on according to independent criteria as dictated by the other systems of aircraft or safety. If it should be on, the route B-1 starting with step 15 is followed; otherwise, the route B-2 with step 18 is followed. In step 15, the on-board charger is switched on or kept on if it is already on. In step 16, the monitor determines whether the user has indicated the need for a test cycle. In the next step (17), a special battery test cycle is performed if the user desires. The on-board charger should be on continuously and should provide a preset minimum output power from the power source, at least for a few minutes in order to be able to complete the test cycle successfully. Otherwise, the test cycle would be aborted automatically. In a preferred version of this invention, the user would press a button or other means to indicate the desirability of this test. The microprocessor can also be programmed to perform the test at regular predetermined intervals. The monitor then charges the battery to 100% SOC, isolates the battery for a preset period and performs the test.

In a preferred embodiment of the invention, the test cycle involves imposing a linearly increasing current or voltage ramp onto the battery terminals and measuring the corresponding voltage or current response of the battery as illustrated in FIG. 7. Typically, the current signal consists of an increasing ramp from 0 A to a preset limit in a preset time interval, holding constant at this value for a preset interval, and a decreasing ramp from this preset level to 0 A in the same preset time interval. For example, the current may be increased from 0 to 20 A in 60 seconds, held at this level for 5 seconds, and decreased from 20 to 0 A in 60 seconds. It is obvious to those in the art that the current output of the power source will be continuously adjusted by the monitor such that the required current for the battery test is available at any instant during the test. When the voltage ramping is used, the signal consists of an increasing ramp from the open circuit voltage (OCV) to an end voltage which is higher than the OCV by a preset limit, as for example, 3 V higher than the OCV, in a preset time interval, and decreased from this level to the OCV in the same preset time interval. In both current ramping and voltage ramping methods, the increasing signal reverts over to the holding portion before the preset time limit is exceeded, whenever a preset voltage limit, e.g., 2.6 V/cell, is reached. The presence of a maximum in dV/dI versus $I_{ramp}$, or a minimum in dI/dV versus $V_{ramp}$ indicates the gas point. From the voltage at the gas point, the number of cells (NOC) is calculated using the following formula:

$$NOC = V_{gas}/2.5 \qquad (5)$$

Figure 8:
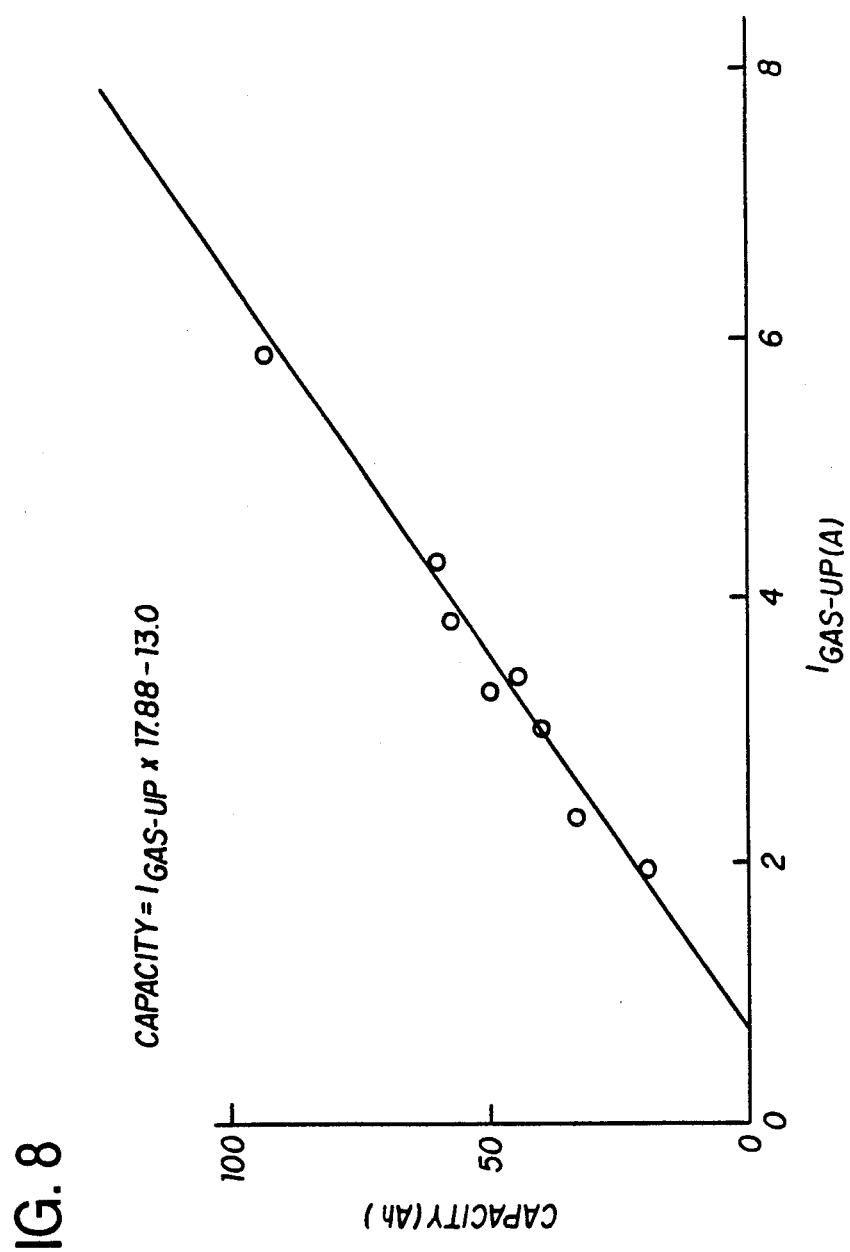
FIG. 8 is a graph depicting battery capacity versus the current at which the battery starts evolving gas.

In an aircraft battery this would normally be equal to the actual number of cells in the battery. Any other number is indicative of a defective battery. The current at which the gas point occurs in the ramp up direction in the case of a fully charged battery, $I_{gas-up}$ is proportional to the battery capacity as illustrated in FIG. 8. The current at which the gas point occurs in the ramp-down direction, $I_{gas-down}$, reaches the lowest possible value, typically around 0.8 A, when the battery is fully charged. Thus, the state of charge can be determined from the $I_{gas-down}$ parameters.

Batteries with mismatched cells give rise to two or more gas points in the ramp up and ramp down directions. Soft-shorted cells exhibit an inflection in dV/dI at very early stages of the ramp. The presence of sulfated cells give rise to an inflection in the ramp-up direction, but no corresponding inflection in the ramp-down direction. The battery status monitor can, thus, determine several battery defects which are often missed by even skilled mechanics.

Sometimes there are early indications of an imminent battery failure. Near the end of its useful life, some cells, especially the end ones, in the battery start losing capacity at different rates. This results in multiple gas points as indicated by the presence of plurality of inflections in dV/dI in both ramp-up and ramp-down during the test cycle, indicating the presence of mismatched cells. When the monitor detects mismatched cells with their capacities differing by more than a preset limit or the capacity of the weakest cell is lower than the preset limit, or if it detects the existence of a soft short in the battery, the monitor warns the user of the necessity to change the battery.

In route B-2 step 18, the monitor switches off power source or keeps it off if it is already off. After step 18 in route B-2 and also after step 17 in route B-1, the control is passed to step 3 in a similar way to the transfer of control to step 3 after step 12 in route A. When the monitor detects the battery user system off in step 5, it follows route C. In this route in step 20, it checks the discharge current from the battery. If the battery output current is more than a preset limit, as for example when there is an accessory on, the monitor warns the user of the excessive leakage current. If the battery drain current is more than a preset limit and the accessories are all off, the monitor warns of the existence of short circuit in the electrical circuitry, related to the battery. The monitor also indicates the existence of a soft short in one of the cells of the battery on detecting an open circuit voltage of the battery lower than a preset limit, when the user system is off and there is no excessive current drain through the accessories. The monitor, then, suggests immediate replacement of the battery.

FIG. 3 is a basic block diagram of an apparatus capable of carrying out the method of this invention. It will be understood by those skilled in the art that the actual electrical circuitry of the aircraft is more complicated than the circuit shown in FIG. 8 incorporating additional accessories and sensors and may be leaving out some of the actuators and shunts; nevertheless, the aircraft circuit can be reduced to this form. The battery (1), current sensing shunt (6), a microprocessor controlled starter switch (8) and a resister representing starter motor load (2) makes up the starting circuit. A resister forming the accessory load (3) represents the accessories, such as lighting and canopy operation in the aircraft. This load, in series with a microprocessor controlled switch (10) and a current sensing shunt (7), could be powered by either the battery through the switch (9) or by the power source (4), i.e., the on-board charger through another microprocessor controlled switch (11). The output voltage of the power source and the battery's state of charge determine which one of them provides power at a given time. The diode 5 prevents the battery from discharging into the power source when it is off. Whenever the battery is to undergo as test ycle, it is isolated from the rest of the electrical circuit using switches 8 and 9 for a few minutes before the test. The power source provides all the power for accessories in this time interval. During the test, switches 9, 10 and 11 remain closed. It will be appreciated that more elements can be added to the circuit to measure additional parameters as, for example, another shunt between the elements 4 and 11 or between the elements 2 and 8. Similarly, additional switches and accessories can be incorporated.

Since the aircraft battery and the automotive starting battery are very similar in their construction and operational characteristics, all out tests in the examples below were made under the automotive condition using an automotive battery. They differ in the number of cells and capacity due to their different size of the loads.

EXAMPLE 1

Determination Of The Internal Resistance And Polarization Of An Automotive Battery An automotive battery of 650 cold cranking amperes (CCA) was placed in a Tenney environmental chamber and subjected to a large pulse current discharge at 25° C. through a copper coil load which is equivalent to a starting motor load of an automobile for which this battery is recommended. The battery status monitor determined the internal resistance (IR), and polarization of the battery at 25° C. to be 7.4 and 1.6 milliOhms respectively. A similar experiment with the battery at 0° C. showed the IR to be 9 mOhms.

EXAMPLE 2

Determination Of Limit IR

The monitor determined an acceptable upper limit for the internal resistance (limit IR) of the above battery in Example 1 using its cold cranking amperes (CCA) rating using the equation 4. This value was 58 mOhms at 25° C.

EXAMPLE 3

Determination Of Low Temperature Limit

The monitor extrapolated the battery limit IR value and the actual internal resistance of the battery, used in Examples 1 and 2, at 25° C. to low temperatures and determined the low temperature limit for startability of the car. This value was −38.7° C. A similar experiment with the battery at 0° C. showed a reliable temperature limit of −38° C. This indicates that whatever is the ambient temperature, the low temperature limit can be determined accurately.

EXAMPLE 4

Testing Batteries Of Different Size Tests, as in Examples 1, 2 and 3 with batteries rated 650, 630, 525, 475, 400 and 340 CCA, at 0° and 25° C. determined the reliable low temperature limit and the internal resistances as shown in Table 1.

TABLE 1

| Automotive Battery Testing With The Monitor | | | | |
|---|---|---|---|---|
| CCA (A) | Ambient Temperature (°C.) | Limit IR (mOhms) | Measured IR (mOhms) | Reliable Temp Limit (°C.) |
| 650 | 25 | 58 | 7.4 | −38.7 |
|  | 0 |  | 9.0 | −38.3 |
| 630 | 25 | 60 | 8.1 | −37.3 |
|  | 0 |  | 10.0 | −35.9 |
| 525 | 25 | 72 | 11.4 | −32.5 |
|  | 0 |  | 13.7 | −32.7 |
| 475 | 25 | 80 | 8.6 | −42.6 |
|  | 0 |  | 10.1 | −42.6 |
| 400 | 25 | 95 | 10.7 | −41.3 |
|  | 0 |  | 12.7 | −41.4 |
| 340 | 25 | 111 | 13.1 | −44.3 |

EXAMPLE 5

Determination Of The State Of Charge

The state of charge (SOC) of the battery in example 1 was determined by the monitor at different known levels of SOC. The battery was discharged for known intervals at a predetermined current. The net charge that went into or out of the battery was measured and added to or subtracted from the predetermined battery capacity respectively. From this value, the SOC of the battery was calculated which compared well with the value determined by the monitor.

An automotive battery was almost completely discharged and left for a day without re-charge. It was then connected to the monitor. The monitor detected the battery's very low state of charge and indicated the need for a full charge. It also displayed that the battery was sulfated.

In tests with another partially discharged battery (SOC 40%), the reliable temperature limit was shown to be higher than 35° C. The ambient temperature of the battery during this test was only 20° C. which meant the car could not be started without charging. Indeed, the power output of the battery was lower than the power required by the load at 20° C.

EXAMPLE 6

Evaluation Of The Battery Capacity

The capacity of the battery in example 1 was determined through a test cycle by the monitor. The battery capacity determined by the monitor compared well with the battery manufacturer's data. The monitor advised to change the battery when it detected half or less of the original capacity under fully charged condition, high internal resistance (twice the initial internal resistance at 25° C.), and high reliable temperature limit when no other problem regarding the battery is detected.

EXAMPLE 7

Testing The Presence Of Mismatched Cells

An old battery with known mismatched cells was connected to the battery status monitor and subjected to a test cycle. The monitor detected the presence of mismatched cells and displayed a warning indicating the same and advised to change the battery.

EXAMPLE 8

Test Of The Gas Saving Feature

The automotive battery in Example 1 was connected to the monitor and the starter switch in the simulation electrical circuit was switched on. The monitor determined the battery characteristics during the starting process and recharged the battery to 100% SOC. It determined the status of the battery and the power source. The monitor switched off the power source after the battery reached full charge. The battery provided all the power needs of the car. When the battery's SOC fell to 80%, the power source was switched on again. Thus the monitor controlled the battery's SOC between 80 and 100% by switching on and off the power source.

EXAMPLE 9

Low Levels Of Electrolyte

A fully charged automotive battery with its electrolyte level at its "full" mark was tested with the monitor for its characteristics. A portion of the electrolyte was withdrawn from the battery until the electrolyte level was just at the top of the electrode plates. The battery was tested again with the monitor. This was repeated with the electrolyte level at ¾, ½ and ¼ of height of the plates. The internal resistance, polarization and the reliable low temperature limit were determined in each of these tests and given in Table 2.

TABLE 2

Battery Characteristics As A Function Of Its Electrolyte Level

| Electrolyte Level | Internal Resistance | Polarization (Equation 2) | Reliable Temp limit |
|---|---|---|---|
| Full | 9.05 mOhm | 1.30 mOhm | −32.4 C. |
| Top of plate | 9.42 | 1.31 | −33.0 |
| ¾th plate | 9.80 | 2.13 | −31.8 |
| ½ plate | 12.91 | 2.68 | −24 |
| ¼ plate | 24.17 | 2.94 | −5.9 |

At electrolyte levels below the top of the plates, higher values of internal resistance, polarization and reliable temperature limit were observed. Thus whenever the monitor detects large values for these parameters coupled with good state of charge and capacity, the monitor advises to add water.

EXAMPLE 10

Corroded Terminals

A fully charged automotive battery's positive terminal was coated with a thin layer of lead sulfate in dilute sulfuric acid with a brush and allowed to dry. Then it was connected as usual to the monitor and the simulation circuit shown in FIG. 3. The internal resistance, polarization and the reliable low temperature limit during the tests under good and corroded terminal conditions are shown in Table 3.

TABLE 3

Characteristics Of An Automotive Battery With Corroded Terminals

| Terminal Status | Internal Resistance | Polarization (Equation 3) | Reliable Temp Limit |
|---|---|---|---|
| Normal | 8.80 mOhm | 1.36 mOhm | −35.3 C. |
| Corroded | 16.46 | 0.48 | −18.9 |

When the monitor detected a large internal resistance, but no significant polarization, normal levels of capacity and state of charge, it advised to clean the thermal.

EXAMPLE 11

Test Of A 630 CCI SLI Battery At Variouse Temperatures

A 630 CCA SLI battery of the size recommended for an Oldsmobile Firenza 2 liter engine car was attached to the battery status monitor and tested at various ambient temperatures in a Tenney environmental chamber. The acceptable IR limit corresponding to the starting power requirements of the car were calculated accordingly by the monitor. The reliable low temperature limits indicated by the monitor are shown in Table 4.

TABLE 4

Test Results Of A 360 CCA Battery Oldsmobile Firenza 2 Liter Engine

| Limit IR | Test Temperature | Predicted Temperature |
|---|---|---|
| 60 mOhm | 25° C. | −36.9° C. |
| | 10 | −36.6 |
| | 0 | −36.0 |
| | −5 | −34.5 |
| | −13 | −35.2 |
| | −25 | −33.0 |
| 30 | −25 | −18.5 |
| | 10 | −18.0 |
| | 0 | −17.2 |
| | −5 | −16.0 |
| | −13 | −17.1 |

TABLE 4-continued

Test Results Of A 360 CCA Battery
Oldsmobile Firenza 2 Liter Engine

| Limit IR | Test Temperature | Predicted Temperature |
|---|---|---|
| | −25 | −15.3 |

They are consistent irrespective of the battery temperature. For the purpose of testing the monitor, a second series of tests were carried out assuming the power needs of the car to be two times the normal value. (This is reflected in the acceptable limit of the IR in Table 4, i.e., half of the original value.) Again, as expected, a higher but consistent value of the reliable low temperature limit was observed for all ambient temperatures.

EXAMPLE 12

Test Of A 525 CCA Battery At Various Temperatures

Similar test results with a 525 CCA battery recommended for a Cutlass Ciera 2.8 liter engine car are shown in Table 5.

TABLE 5

Test Results Of A 525 CCA Battery
Cutlass Ciera - 2.8 Liter Engine

| Limit IR | Test Temperature | Predicted Temperature |
|---|---|---|
| 72 mOhm | 25° C. | −32.5° C. |
| | 10 | −32.6 |
| | 0 | −32.7 |
| | −5 | −31.4 |
| | −13 | −32.9 |
| | −25 | −30.2 |
| 36 | 25 | −13.8 |
| | 10 | −13.5 |
| | 0 | −14.2 |
| | −5 | −12.3 |
| | −13 | −14.5 |
| | −25 | −11.6 |

The monitor tested the battery characteristics as discussed beore and operated successfully. The results are similar to the results of Example 11.

What is claimed is:

1. A battery condition monitoring apparatus for providing status and advice concerning a storage battery in an aircraft, comprising:
   (a) microprocessor means located on said aircraft for controlling the operations of said apparatus;
   (b) software means for instructing said microprocessor means to control the sequence of said operations;
   (c) memory means connected to said microprocessor means for storing said software instructions and predetermined relationships between the internal resistance of said battery, the tolerable limit of said internal resistance and the ambient temperature of said battery;
   (d) digital to analog converter means connected to said microprocessor means for converting digital signals from said microprocessor means to analog signals;
   (e) direct current power generator means, connected to said digital to analog converter means, for producing electric power at voltage and current, required by said microprocessor means;
   (f) current sensor means, connected to a terminal of said battery; for measuring the current passing into and out of said battery;
   (g) temperature sensor means, located near said battery, for measuring the ambient temperature of said battery;
   (h) voltmeter means for measuring the voltages of said battery, current sensor, temperature sensor and direct current power generator means;
   (i) analog to digital converter means, connected to said voltmeter, for converting the analog signals from the said voltage measurements to digital signals appointed for transfer to said microprocessor;
   (j) second software means for analyzing said current, voltages and temperature, and for determining the internal resistance and polarization of said battery, defects in said battery, and low temperature starting limit, to establish said battery maintenance and replacement requirements;
   (k) actuator means for controlling the electrical circuits connecting said sensors, said direct current power generating means and said battery; and
   (l) display means, controlled by said microprocessor for indicating said battery status and advice.

2. An apparatus according to claim 1, wherein said storage battery is a rechargeable battery including a lead acid battery and said direct current power generating means is an on-board or ground based charger means.

3. A method for monitoring an aircraft storage battery, which comprises the steps of:
   (a) measuring continuously the ambient temperature, the battery voltage, the charger output voltage, and the current to and from said battery;
   (b) analyzing said current-voltage (I–V) data to determine the internal resistance and polarization of said battery said, internal resistance of said battery being determined from the instantaneous change in voltage at the beginning or at the end of a current input to or output from the battery which instantaneous charge in voltage is caused by switching on or switching off charge pulse current to or discharge pulse current from said battery and said polarization of said battery being determined from a change in voltage during a predetermined time interval immediately following said instantaneous change;
   (c) determining the state of charge, and fault conditions, including fault conditions produced by corroded terminals, and low electrolyte level;
   (d) determining the low temperature limit by comparing the battery's power output capability with power requirements of said aircraft component system including the starting system; and
   (e) indicating data produced by said comparison.

4. A method according to claim 3, further comprising the steps of:
   (a) determining the aircraft component power requirements, including the engine starting power requirements at various temperatures by extrapolating the power actually used by the said component at any one temperature using a predetermined mathematical function or graphical data that relates the battery's power output capability with various temperatures.

5. A method as in claim 4 wherein the aircraft component power requirements, including the engine power requirements are determined from the required rating of said battery, as recommended by the component manufacturer.

6. A method as recited by claim 4, wherein the internal resistance is determined from battery voltage and current data collected while switching on or switching off of a discharge pulse current from the battery, said discharge pulse being caused by a starter load or other accessory load.

7. A method as recited by claim 4, wherein the internal resistance is determined from battery voltage and current data collected while switching on or switching off of a charge pulse current to said battery from the charger.

8. A method as recited by claim 4, further comprising the step of determining battery capacity by measuring the charge input to the battery and the corresponding increase in the battery voltage.

9. A method as recited by claim 4, wherein the state of charge of said battery is determined from the open circuit voltage when there is no change in said open circuit voltage, and from counting the charge into and out of said battery starting from a predetermined charged state as determined from said open circuit voltage when said battery open circuit voltage is not substantially constant.

10. A method as recited by claim 4, wherein the internal resistance of the battery is determined by dividing the difference between the last battery voltage reading when the engine is in an off condition and the first battery voltage reading during engine starting condition by the current passing out of said battery during said starting condition.

11. A method as recited by claim 4, wherein the polarization of said battery is determined by dividing the difference between the first battery voltage reading and the battery voltage reading after a preset interval of time during engine starting condition by the current passing out of said battery during said starting condition.

12. A method as recited by claim 4, wherein a low electrolyte level and a need for addition of water are indicated when said polarization and internal resistance are larger than a predetermined levels and said state of charge and capacity are above preset levels.

13. A method as recited by claim 4, wherein corroded terminals and a need for cleaning terminals are indicated when state of charge and capacity of said battery are above preset levels, the internal resistance is higher than a preset limit and said polarization is below a preset limit.

14. A method as recited by claim 4, wherein end of useful life of said battery and a need to change it are indicated, upon detection of (i) one or more soft-shorted cells or (ii) internal resistance higher than a preset limit, together with normal polarization and state of charge higher than a preset limit.

15. A method as recited by claim 4, wherein presence of a soft shorted cell is detected by decrease of said battery's open circuit voltage to a stable value lower than a preset level.

16. A method as recited by claim 4, further comprising the step of switching the charger on and off to keep the battery's state of charge within a preset limit.

17. A method as recited by claim 4, further comprising the steps of:
(a) subjecting said battery to a special test cycle wherein a predetermined profile of current or voltage is imposed onto the battery by the charging system and the battery response voltage or current is measured;
(b) evaluating the data in the forms, dV/dI versus I, or dI/dV versus V;
(c) determining the battery characteristics, including the capacity, and the voltage;
(d) determining the battery defects, including mismatched cell, soft-shorter cell, and loss of capacity; and
(e) indicating said data and advice.

18. A method as recited by claim 17, wherein the end of useful life of said battery is indicated by the presence of mismatched cells or soft-shorted cells.

19. A method for monitoring an aircraft storage battery, which comprises the steps of:
(a) measuring continuously the ambient temperature, the battery voltage, the charger output voltage, and the current to and from said battery;
(b) analysing said current-voltage (I–V) data to determined the internal resistance and polarization of said battery, and to determine therefrom battery life and fault conditions produced from corroded terminals and low electrolyte level;
(c) determining the state of charge, and fault conditions by:
  (i) subjecting said battery to a special test cycle wherein a predetermined profile of current or voltage having increasing applied current or voltage (ramp up) and decreasing applied current or voltage (ramp down) directions is imposed onto the battery by the charging system and the battery response voltage or current is measured, the state of charge being determined from the current at which gas inside said battery stops evolving in the ramp down direction;
  (ii) evaluating the data in the forms, dV/dI versus I, or dI/dV versus V;
  (iii) determining the battery characteristics, including the capacity, and the voltage;
  (iv) determining the battery defects, including mismatched cell, soft-shorted cell, and loss of capacity; and
  (v) indicating said data and advice;
(d) determining the low temperature limit by comparing the battery's power output capability with power requirements of said aircraft component system including the starting system, the determination of engine starting power requirements being made at various temperatures by extrapolating the power actually used by the engine at any one temperature using a predetermined mathematical function or graphical data that relates the battery's power output capability with various temperatures; and
(e) indicating data produced by said comparison.

20. A method for monitoring an aircraft storage battery, which comprises the steps of:
(a) measuring continuously the ambient temperature, the battery voltage, the charger output voltage, and the current to and from said battery;
(b) analysing said current-voltage (I–V) data to determine the internal resistance and polarization of said battery and to determine therefrom battery life and fault conditions produced from corroded terminals and low electrolyte level;
(c) determining the state of charge, and fault conditions by:
  (i) subjecting said battery to a special test cycle wherein a predetermined profile of current or voltage having increasing applied current or voltage (ramp up) and decreasing applied current or voltage (ramp down) directions is imposed onto the battery by the charging system and the battery response voltage or current is measured;

(ii) evaluating the data in the forms, dV/dI versus I, or dI/dV versus V;

(iii) determining the battery characteristics, including the capacity, and the voltage, said battery capacity being determined from the current at which said battery starts evolving gas in said battery in the ramp up direction;

(iv) determining the battery defects, including mismatched cell, soft-shorted cell, and loss of capacity; and (v) indicating said data and advice;

(d) determining the low temperature starting limit by comparing the battery's power output capability with starting power requirements of said aircraft component system including the starting system, the determination of engine starting power requirements being made at various temperatures by extrapolating the power actually used by the engine at any one temperature using a predetermined mathematical function or graphical data that relates the battery's power output capability with various temperatures; and (e) indicating data produced by said comparison.

* * * * *